(12) United States Patent
Han

(10) Patent No.: US 10,497,736 B2
(45) Date of Patent: Dec. 3, 2019

(54) BACKSIDE ILLUMINATED IMAGE SENSOR

(71) Applicant: DB HITEK CO., LTD., Seoul (KR)

(72) Inventor: Chang Hun Han, Gyeonggi-do (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 16/031,685

(22) Filed: Jul. 10, 2018

(65) Prior Publication Data

US 2019/0019822 A1 Jan. 17, 2019

(30) Foreign Application Priority Data

Jul. 11, 2017 (KR) .................. 10-2017-0087879

(51) Int. Cl.
*H01L 27/146* (2006.01)

(52) U.S. Cl.
CPC ...... *H01L 27/1464* (2013.01); *H01L 27/1463* (2013.01); *H01L 27/14621* (2013.01); *H01L 27/14623* (2013.01); *H01L 27/14627* (2013.01); *H01L 27/14638* (2013.01); *H01L 27/14683* (2013.01); *H01L 27/14685* (2013.01)

(58) Field of Classification Search
CPC ......... H01L 27/14621; H01L 27/14623; H01L 27/14627; H01L 27/1463; H01L 27/14638
See application file for complete search history.

(56) References Cited

U.S. PATENT DOCUMENTS

| 2008/0150057 A1* | 6/2008 | Lee ................... H01L 27/14623 257/432 |
| 2012/0313208 A1 | 12/2012 | Kim et al. |
| 2013/0249039 A1* | 9/2013 | Hsu ................... H01L 27/14623 257/435 |
| 2016/0013241 A1* | 1/2016 | Yamaguchi ....... H01L 27/14645 257/225 |
| 2017/0229497 A1 | 8/2017 | Han |

OTHER PUBLICATIONS

U.S. Appl. No. 16/046,148, filed Jul. 26, 2018, Inventor(s): Han.

\* cited by examiner

*Primary Examiner* — Dung A. Le
(74) *Attorney, Agent, or Firm* — Patterson Thuente Pedersen, P.A.

(57) ABSTRACT

A backside illuminated image sensor includes pixel regions disposed in a substrate, an anti-reflective layer disposed on a backside surface of the substrate, a light-blocking pattern disposed on the anti-reflective layer and having openings corresponding to the pixel regions, a color filter layer disposed on the light-blocking pattern, and a micro lens array disposed on the color filter layer, wherein the light-blocking pattern has a width decreasing toward the backside surface of the substrate.

13 Claims, 13 Drawing Sheets

BACKSIDE ILLUMINATED IMAGE SENSOR

CROSS-REFERENCE TO RELATED APPLICATION

This application claims the priority benefit of Korean Patent Application No. 10-2017-0087879, filed on Jul. 11, 2017, and all the benefits accruing therefrom under 35 U.S.C. § 119, the contents of which are incorporated by reference in their entirety.

BACKGROUND

The present disclosure relates to a backside illuminated image sensor and a method of manufacturing the same.

In general, an image sensor is a semiconductor device that converts an optical image into electrical signals, and may be classified or categorized as a charge coupled device (CCD) or a complementary metal oxide semiconductor (CMOS) image sensor (CIS).

The CIS includes unit pixels, each including a photodiode and MOS transistors. The CIS sequentially detects the electrical signals of the unit pixels using a switching method, thereby forming an image. The CIS may be classified into a frontside illuminated image sensor and a backside illuminated image sensor.

The frontside illuminated image sensor may include photodiodes formed in a substrate, transistors formed on a frontside surface of the substrate, wiring layers formed on the frontside surface of the substrate, and a color filter layer and micro lens array formed on the wiring layers.

Meanwhile, the backside illuminated image sensor may have an improved light-receiving efficiency in comparison with the frontside illuminated image sensor. The backside illuminated image sensor may include transistors and wiring layers formed on a frontside surface of a substrate, a light-blocking pattern and an anti-reflective layer formed on a backside surface of the substrate, a passivation layer formed on the light-blocking pattern and the anti-reflective layer, and a color filter layer and a micro lens array formed on the passivation layer.

The light-blocking pattern may be made of tungsten and may be formed by forming a tungsten layer on the anti-reflective layer and patterning the tungsten layer to have openings corresponding to pixel regions of the backside illuminated image sensor. In such case, the light-blocking pattern may have a width increasing toward the backside surface of the substrate. More specifically, because it is relatively difficult to etch the tungsten layer, the tungsten layer may be etched so that side surfaces of the light-blocking pattern have a positive slope, and there is a limit to increase a thickness of the tungsten layer. Thus, the light loss may be increased by the light reflection on the side surfaces of the light-blocking pattern, and the effect of reducing the crosstalk by using the light-blocking pattern is also limited.

SUMMARY

The present disclosure provides a backside illuminated image sensor capable of reducing the light loss and the crosstalk and a method of manufacturing the backside illuminated image sensor.

In accordance with an aspect of the present disclosure, a backside illuminated image sensor may include pixel regions disposed in a substrate, an anti-reflective layer disposed on a backside surface of the substrate, a light-blocking pattern disposed on the anti-reflective layer and having openings corresponding to the pixel regions, a color filter layer disposed on the light-blocking pattern, and a micro lens array disposed on the color filter layer, wherein the light-blocking pattern has a width decreasing toward the backside surface of the substrate. In accordance with some exemplary embodiments of the present disclosure, each of the pixel regions may include a charge accumulation region disposed in the substrate, and a frontside pinning layer disposed between a frontside surface of the substrate and the charge accumulation region.

In accordance with some exemplary embodiments of the present disclosure, the each of the pixel regions may further include a backside pinning layer disposed between the backside surface of the substrate and the charge accumulation region.

In accordance with some exemplary embodiments of the present disclosure, the backside illuminated image sensor may further include floating diffusion regions disposed in the substrate to be spaced apart from the pixel regions, and gate structures disposed on the frontside surface of the substrate and between the pixel regions and the floating diffusion regions.

In accordance with some exemplary embodiments of the present disclosure, the backside illuminated image sensor may further include a passivation layer disposed on the anti-reflective layer and the light-blocking pattern. In such case, the color filter layer may be disposed on the passivation layer.

In accordance with some exemplary embodiments of the present disclosure, the backside illuminated image sensor may further include a mold layer disposed on the anti-reflective layer and having trenches for forming the light-blocking pattern, and a passivation layer disposed on the mold layer and the light-blocking pattern.

In accordance with some exemplary embodiments of the present disclosure, the backside illuminated image sensor may further include a diffusion barrier layer disposed on side surfaces of the light-blocking pattern and between the anti-reflective layer and the light-blocking pattern.

In accordance with some exemplary embodiments of the present disclosure, the backside illuminated image sensor may further include a second diffusion barrier layer disposed on the light-blocking pattern.

In accordance with another aspect of the present disclosure, a method of manufacturing a backside illuminated image sensor may include forming pixel regions in a substrate, forming an anti-reflective layer on a backside surface of the substrate, forming a light-blocking pattern having openings corresponding to the pixel regions on the anti-reflective layer, forming a color filter layer on the light-blocking pattern, and forming a micro lens array on the color filter layer, wherein the light-blocking pattern has a width decreasing toward the backside surface of the substrate.

In accordance with some exemplary embodiments of the present disclosure, the forming pixel regions may include forming charge accumulation regions in the substrate, and forming frontside pinning layers between a frontside surface of the substrate and the charge accumulation regions.

In accordance with some exemplary embodiments of the present disclosure, the forming pixel regions may further include forming backside pinning layers between the backside surface of the substrate and the charge accumulation regions.

In accordance with some exemplary embodiments of the present disclosure, the method may further include forming floating diffusion regions in the substrate to be spaced apart from the pixel regions, and forming gate structures on a frontside surface of the substrate and between the pixel regions and the floating diffusion regions.

In accordance with some exemplary embodiments of the present disclosure, forming a light-blocking pattern may include forming a mold layer on the anti-reflective layer to have trenches for forming the light-blocking pattern, forming a metal layer on the mold layer so that the trenches are buried, and performing a planarization process so that the mold layer is exposed to form the light-blocking pattern in the trenches, wherein the trenches has a width decreasing toward the backside surface of the substrate.

In accordance with some exemplary embodiments of the present disclosure, the method may further include removing the mold layer after forming the light-blocking pattern, and forming a passivation layer on the anti-reflective layer and the light-blocking pattern.

In accordance with some exemplary embodiments of the present disclosure, the method may further include forming a passivation layer on the mold layer and the light-blocking pattern.

In accordance with some exemplary embodiments of the present disclosure, the method may further include forming a diffusion barrier layer on the mold layer and a portion of the anti-reflective layer exposed by the trenches before forming the metal layer.

In accordance with some exemplary embodiments of the present disclosure, the method may further include forming a second diffusion barrier layer on the light-blocking pattern.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Exemplary embodiments can be understood in more detail from the following description taken in conjunction with the accompanying drawings, in which.

Figure 1:
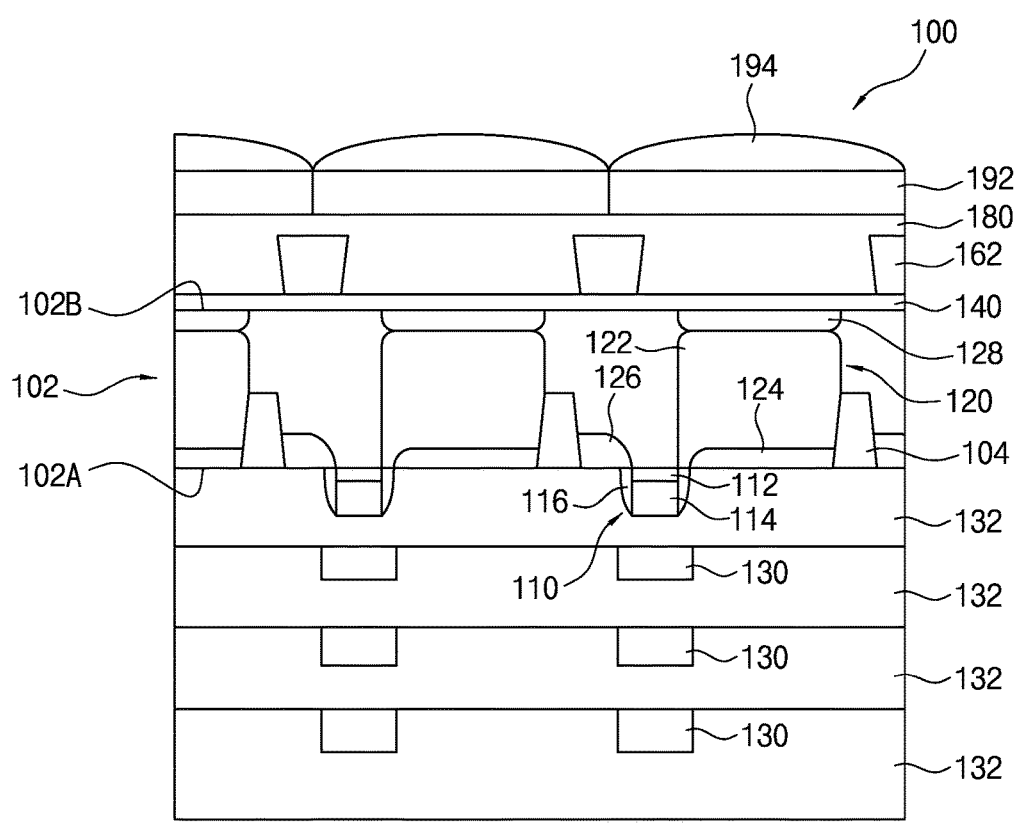
FIG. 1 is a cross-sectional view illustrating a backside illuminated image sensor in accordance with an exemplary embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

FIG. 1 is a cross-sectional view illustrating a backside illuminated image sensor in accordance with an exemplary embodiment of the present disclosure. Referring to FIG. 1, a backside illuminated image sensor 100, in accordance with an exemplary embodiment of the present disclosure, may include pixel regions 120 disposed in a substrate 102. Each of the pixel regions 120 may include a charge accumulation region 122 in which charges generated by the incident light are accumulated. The charge accumulation regions 122 may be disposed in the substrate 102, and floating diffusion regions 126 may be disposed in frontside surface portions of the substrate 102 to be spaced apart from the charge accumulation regions 122.

The substrate 102 may have a first conductivity type, and the charge accumulation regions 122 and the floating diffusion regions 126 may have a second conductivity type. For example, a p-type substrate may be used as the substrate 102, and n-type impurity diffusion regions functioning as the charge accumulation regions 122 and the floating diffusion regions 126 may be formed in the p-type substrate 102.

Transfer gate structures 110 may be disposed on channel regions between the charge accumulation regions 122 and the floating diffusion regions 126 to transfer the charges accumulated in the charge accumulation regions 122 to the floating diffusion regions 126. Each of the transfer gate structures 110 may include a gate insulating layer 112 disposed on a frontside surface 102A of the substrate 102, a gate electrode 114 disposed on the gate insulating layer 112, and gate spacers 116 disposed on side surfaces of the gate electrode 114. Further, though not shown in figures, the backside illuminated image sensor 100 may include reset transistors, source follower transistors, and select transistors electrically connected with the floating diffusion regions 126.

Alternatively, if the backside illuminated image sensor 100 is a 3T (i.e., fewer than three transistors) layout, the transfer gate structures 110 may be used as reset gate structures and the floating diffusion regions 126 may be used as active regions for connecting the charge accumulation regions 122 with reset circuitries (not shown).

The pixel regions 120 may include a frontside pinning layer 124 disposed between the frontside surface 102A of the substrate 102 and the charge accumulation region 122, respectively. Further, the pixel regions 120 may include a backside pinning layer 128 disposed between a backside surface 102B of the substrate 102 and the charge accumulation region 122, respectively. The frontside and backside pinning layers 124 and 128 may have the first conductivity type. For example, p-type impurity diffusion regions may be used as the frontside and backside pinning layers 124 and 128.

Wiring layers 130 may be disposed on the frontside surface 102A of the substrate 102 and may be electrically connected with the pixel regions 120. Further, insulating layers 132 may be disposed on the frontside surface 102A of the substrate 102 and between the wiring layers 130.

An anti-reflective layer 140 may be disposed on the backside surface 102B of the substrate 102, and a light-blocking pattern 162 having openings 162A (refer to FIG. 15) corresponding to the pixel regions 120 may be disposed on the anti-reflective layer 140. Further, a passivation layer 180 may be disposed on the anti-reflective layer 140 and the light-blocking pattern 162, a color filter layer 192 may be disposed on the passivation layer 180, and a micro lens array 194 may be disposed on the color filter layer 192. Further, the pixel regions 120 may be electrically isolated by device isolation regions 104.

In accordance with an exemplary embodiment of the present disclosure, the light-blocking pattern 162 may have a width decreasing toward the backside surface 102B of the substrate 102 so as to reduce the light loss and the crosstalk of the backside illuminated image sensor 100. That is, the light-blocking pattern 162 may have an upper width wider than a lower width, and the openings 162A may have an upper width narrower than a lower width. For example, side surfaces of the light-blocking pattern 162 may have a negative slope, and the light reflection on the side surfaces of the light-blocking pattern 162 may thus be reduced. As a result, the light loss due to the light reflection on the side surfaces of the light-blocking pattern 162 may be significantly reduced. Further, the light-blocking pattern 162 may be formed by a damascene process using a metal material, thereby relatively increasing a thickness of the light-blocking pattern 162. As a result, the effect of reducing the crosstalk by using the light-blocking pattern 162 may be significantly improved.

Figure 2:
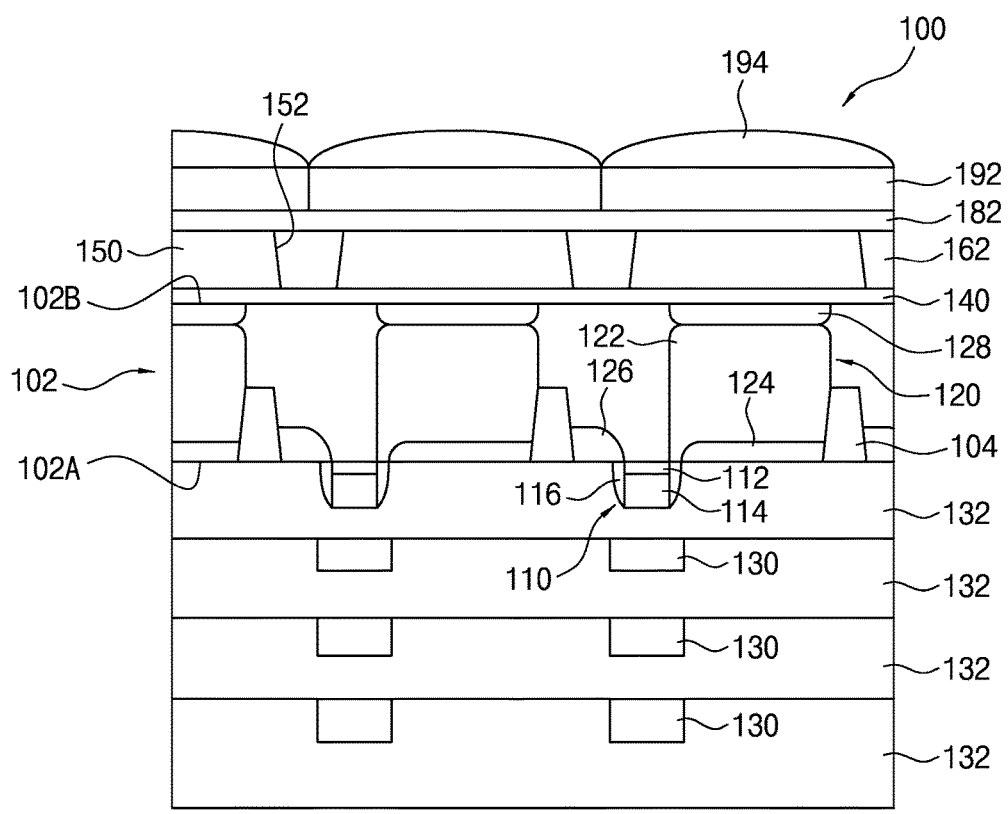
FIG. 2 is a cross-sectional view illustrating a backside illuminated image sensor in accordance with another exemplary embodiment of the present disclosure.

FIG. 2 is a cross-sectional view illustrating a backside illuminated image sensor in accordance with another exemplary embodiment of the present disclosure. Referring to FIG. 2, the backside illuminated image sensor 100 may include a mold layer 150 disposed on the anti-reflective layer 140. The mold layer 150 may have trenches 152 for forming the light-blocking pattern 162, and a passivation layer 182 may be disposed on the mold layer 150 and the light-blocking pattern 162. For example, the mold layer 150 may be made of silicon oxide, and the trenches 152 may be formed by an anisotropic etching process. Particularly, the trenches 152 may have a width decreasing toward the backside surface 102B of the substrate 102 by the anisotropic etching process. That is, inner side surfaces of the trenches 152 may have a positive slope.

Figure 3:
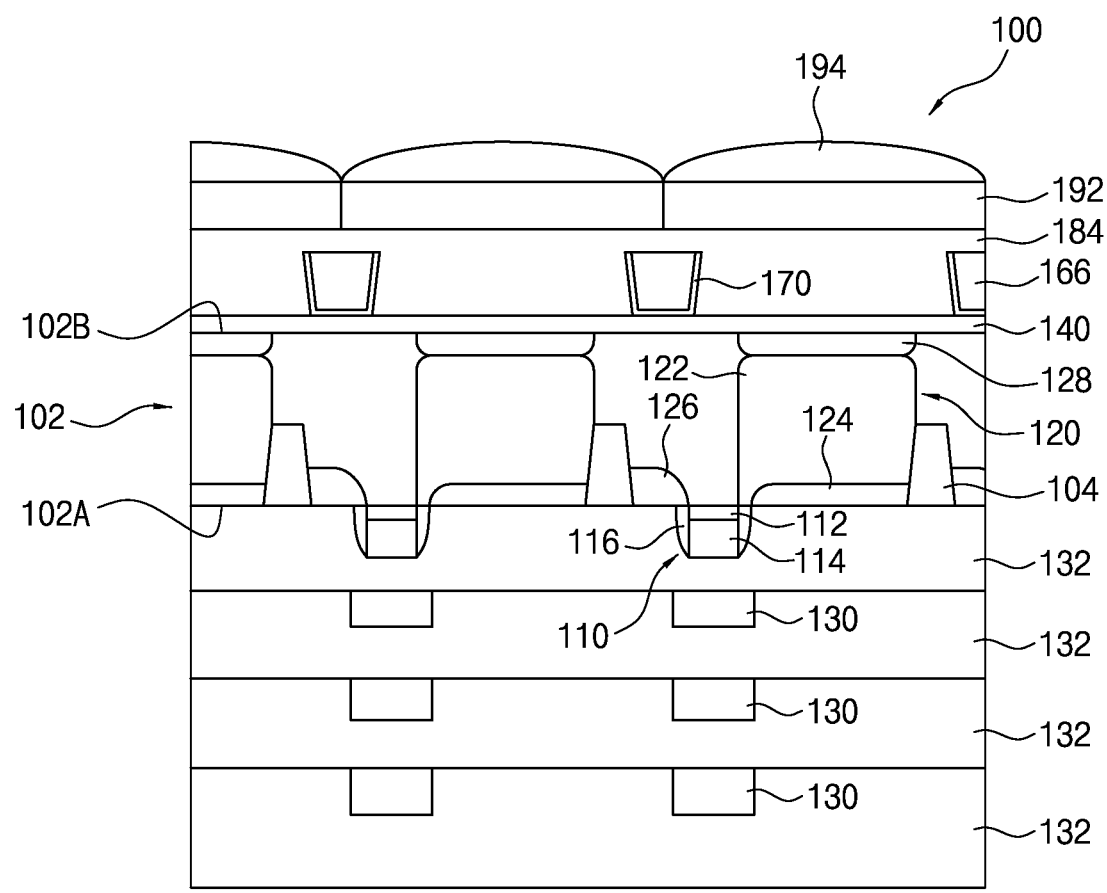
FIGS. 3 and 4 are cross-sectional views illustrating backside illuminated image sensors in accordance with some exemplary embodiments of the present disclosure.
Figure 4:
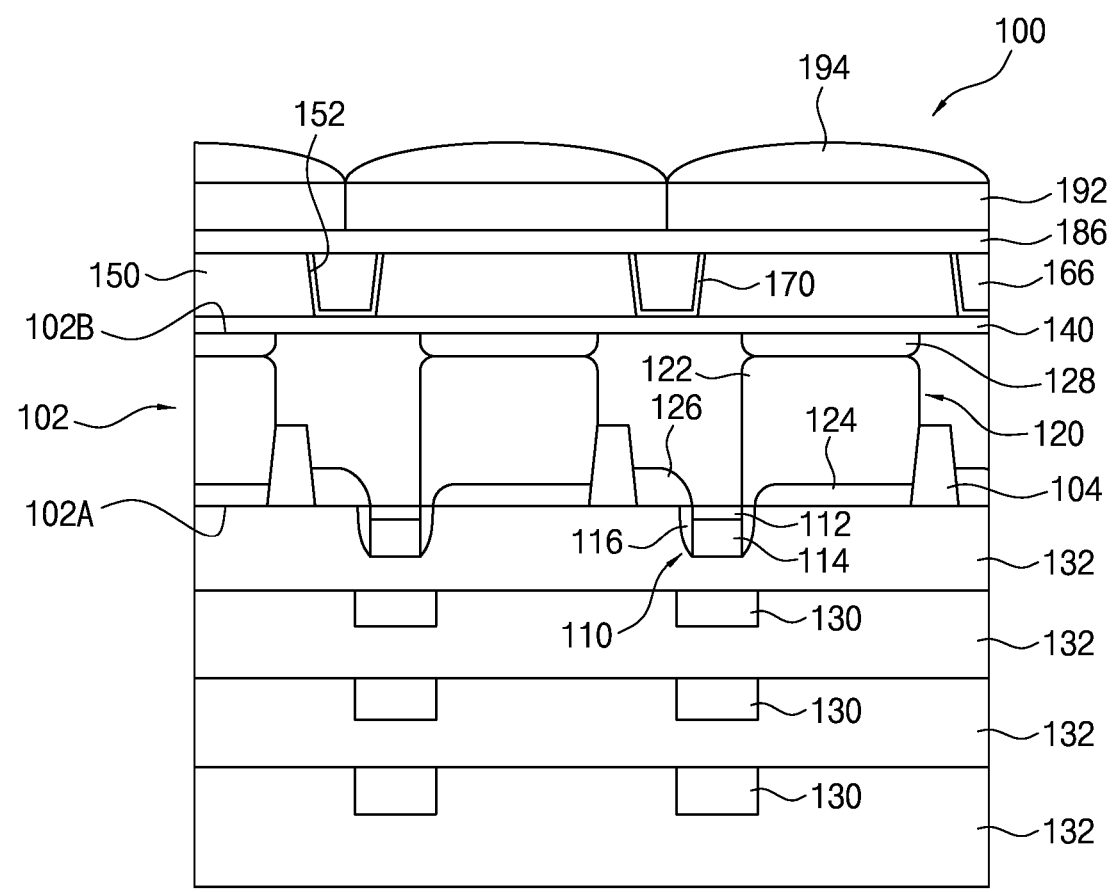

FIGS. 3 and 4 are cross-sectional views illustrating backside illuminated image sensors in accordance with some exemplary embodiments of the present disclosure.

Referring to FIGS. 3 and 4, a light-blocking pattern 166 may be made of a metal material. For example, the light-blocking pattern 166 may be made of tungsten. Alternatively, the light-blocking pattern 166 may be formed of aluminum or copper. In accordance with some exemplary embodiments of the present disclosure, a diffusion barrier layer 170 may be disposed on side surfaces of the light-blocking pattern 166 and between the anti-reflective layer 140 and the light-blocking pattern 166 to prevent metal diffusion. For example, a tungsten nitride layer, a titanium nitride layer or tantalum nitride layer may be used as the diffusion barrier layer 170.

Figure 5:
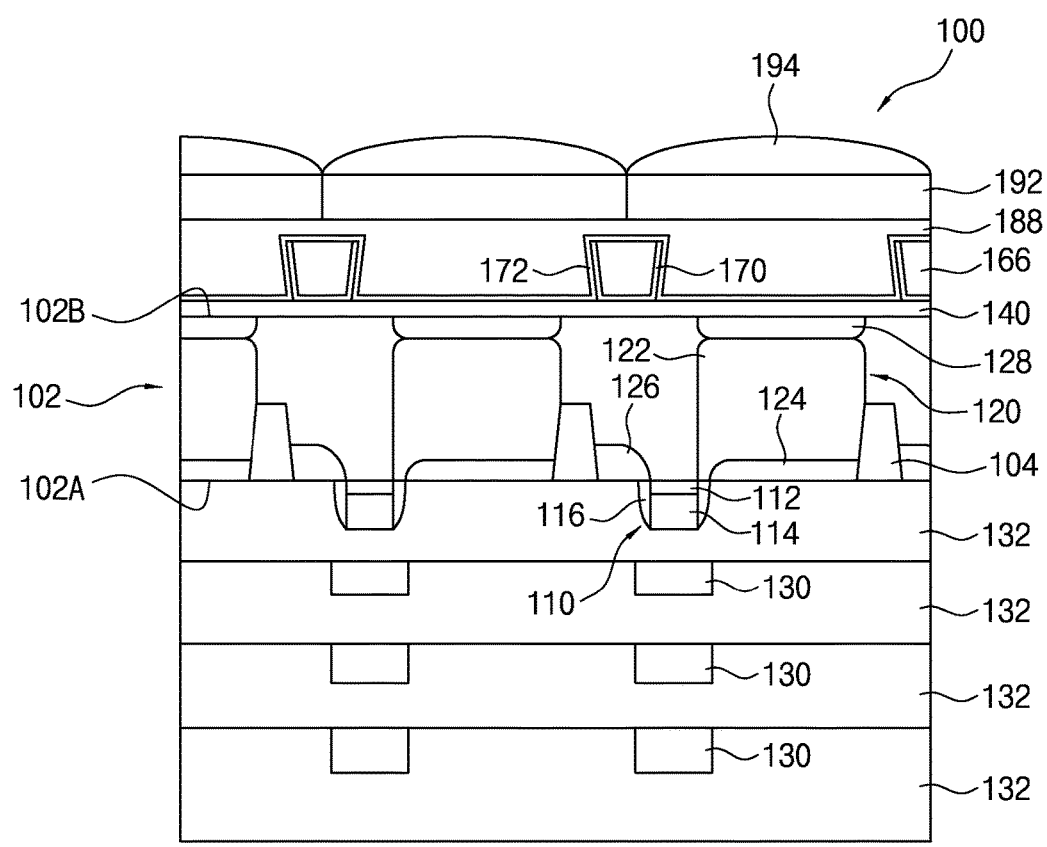
FIGS. 5 and 6 are cross-sectional views illustrating backside illuminated image sensors in accordance with some exemplary embodiments of the present disclosure.
Figure 6:
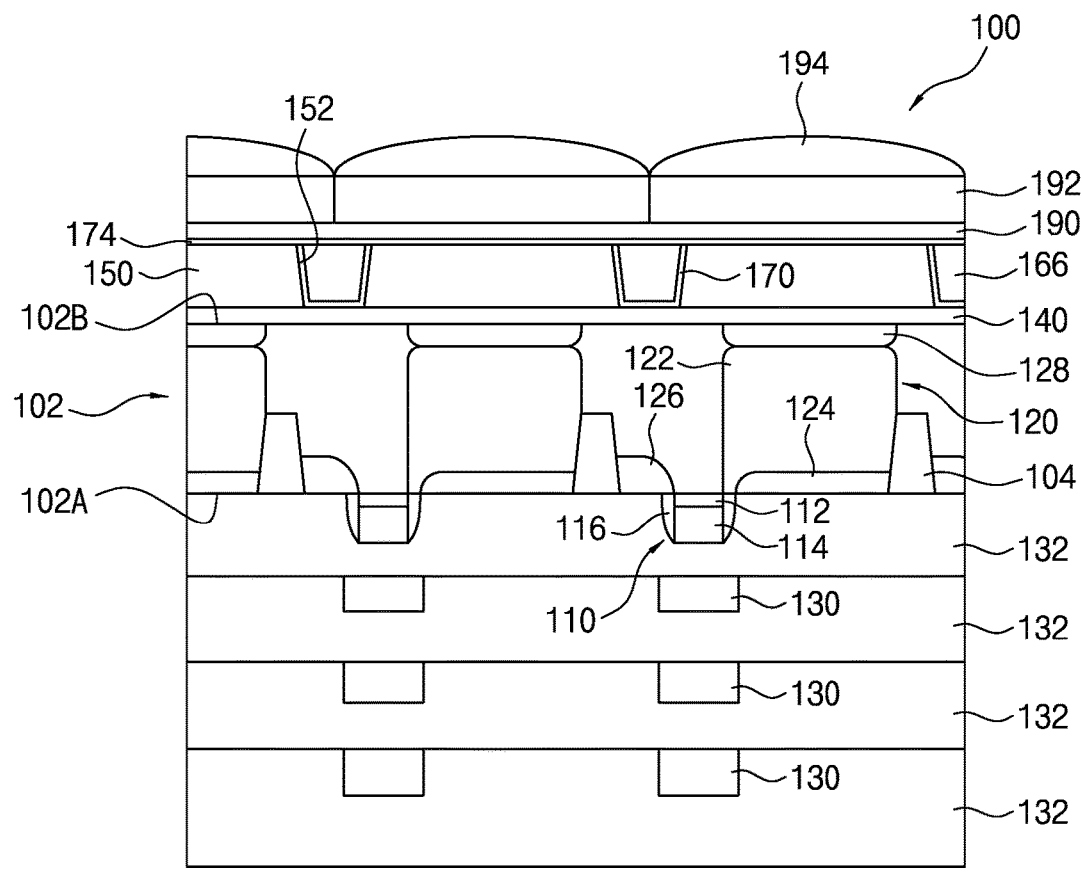

FIGS. 5 and 6 are cross-sectional views illustrating backside illuminated image sensors in accordance with some exemplary embodiments of the present disclosure.

Referring to FIGS. 5 and 6, a second diffusion barrier layer 172 and 174 may be disposed on the light-blocking pattern 166. For example, as shown in FIG. 5, a second diffusion barrier layer 172 may be disposed on the light-blocking pattern 166, the diffusion barrier layer 170 and the anti-reflective layer 140. Further, as shown in FIG. 6, a second diffusion barrier layer 174 may be disposed on the light-blocking pattern 166 and the mold layer 150. For example, a silicon nitride layer may be used as the second diffusion barrier layer 172 and 174.

FIGS. 7 to 15 are cross-sectional views illustrating a method of manufacturing the backside illuminated image sensor as shown in FIG. 1.

Figure 7:
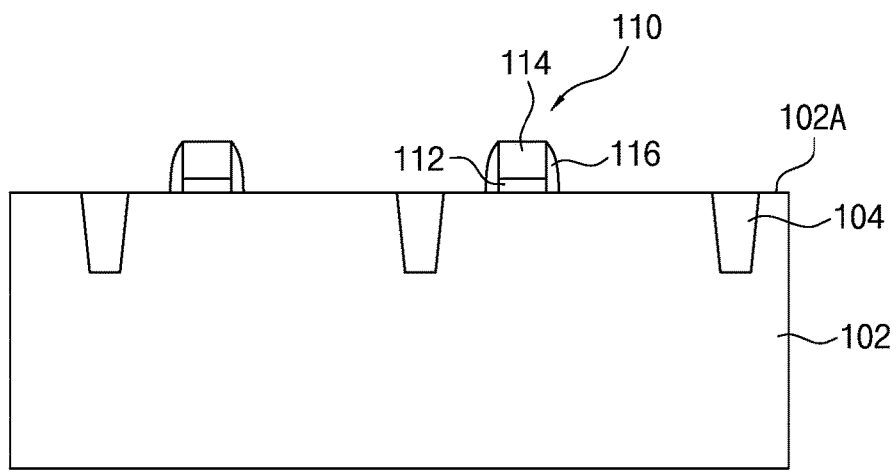
FIGS. 7 to 15 are cross-sectional views illustrating a method of manufacturing the backside illuminated image sensor as shown in FIG. 1.

Referring to FIG. 7, device isolation regions 104 may be formed in frontside surface portions of a substrate 102 to define active regions of the backside illuminated image sensor 100. The substrate 102 may have a first conductivity type. For example, a p-type substrate may be used as the substrate 102. Alternatively, the substrate 102 may include a bulk silicon substrate and a p-type epitaxial layer formed on the bulk silicon substrate. The device isolation regions 104 may be made of silicon oxide and may be formed by a shallow trench isolation (STI) process.

After forming the device isolation regions 104, transfer gate structures 110 may be formed on a frontside surface 102A of the substrate 102. Each of the transfer gate structures 110 may include a gate insulating layer 112, a gate electrode 114 formed on the gate insulating layer 112 and gate spacers 116 formed on side surfaces of the gate electrode 114. Further, though not shown in figures, reset gate structures, source follower gate structures and select gate structures may be simultaneously formed with the transfer gate structures 110 on the frontside surface 102A of the substrate 102.

Figure 8:
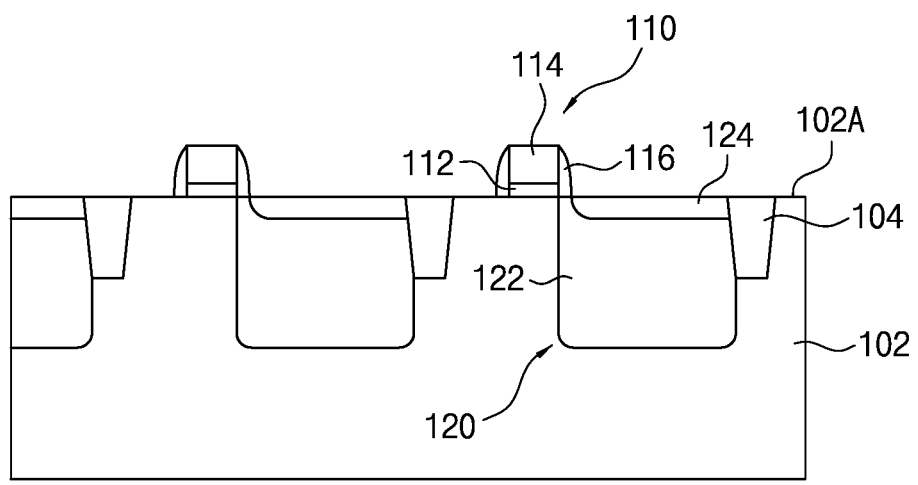

Referring to FIG. 8, charge accumulation regions 122 used as pixel regions 120 may be formed in the substrate 102. In detail, charge accumulation regions 122 having a second conductivity type may be formed in the active regions of the substrate 102. For example, n-type charge accumulation regions 122 may be formed in the p-type substrate 102. The n-type charge accumulation regions 122 may be n-type impurity diffusion regions formed by an ion implantation process.

Frontside pinning layers 124 having the first conductivity type may be formed between the frontside surface 102A of the substrate 102 and the charge accumulation regions 122. For example, p-type frontside pinning layers 124 may be formed between the frontside surface 102A of the substrate 102 and the n-type charge accumulation regions 122 by an ion implantation process. The p-type frontside pinning layers 124 may be p-type impurity diffusion regions. The n-type charge accumulation regions 122 and the p-type frontside pinning layers 124 may be activated by a subsequent rapid heat treatment process.

Figure 9:
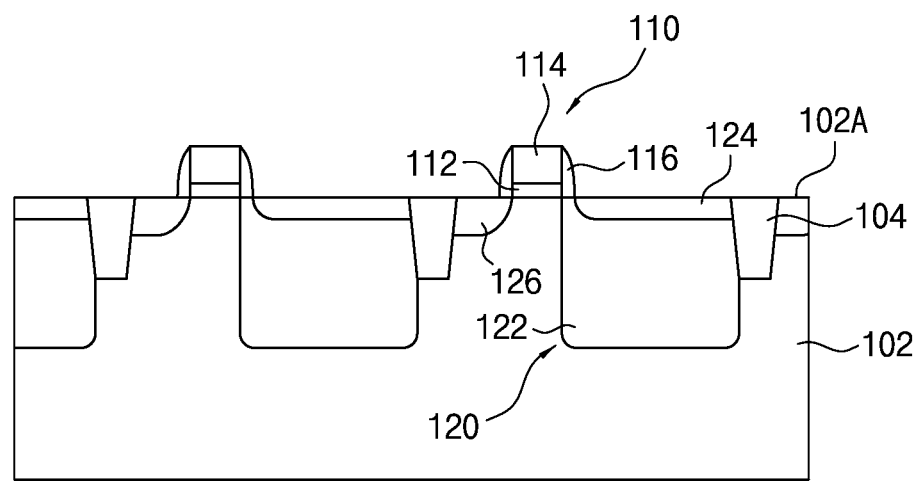

Referring to FIG. 9, floating diffusion regions 126 having the second conductivity type may be formed in frontside surface portions of the substrate 102 to be spaced apart from the charge accumulation regions 122. For example, the floating diffusion regions 126 may be n-type high concentration impurity regions, which may be formed by an ion implantation process. At this time, the transfer gate structures 110 may be arranged on channel regions between the charge accumulation regions 122 and the floating diffusion regions 126.

Figure 10:
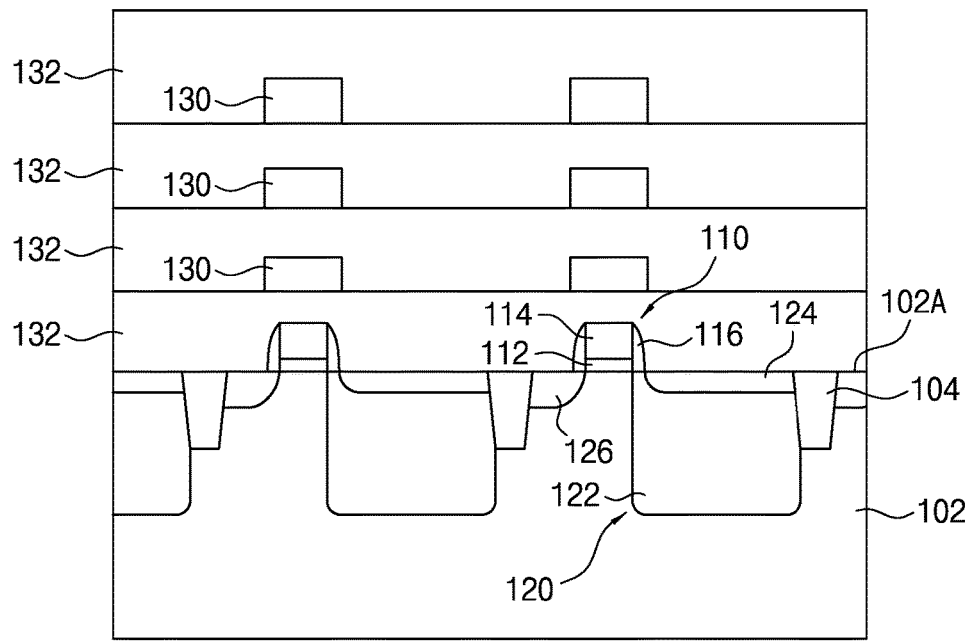

Referring to FIG. 10, wiring layers 130 may be formed on the frontside surface 102A of the substrate 102 to be electrically connected with the pixel regions 120. Further, insulating layers 132 may be formed on the frontside surface 102A of the substrate 102 and between the wiring layers 130.

Figure 11:
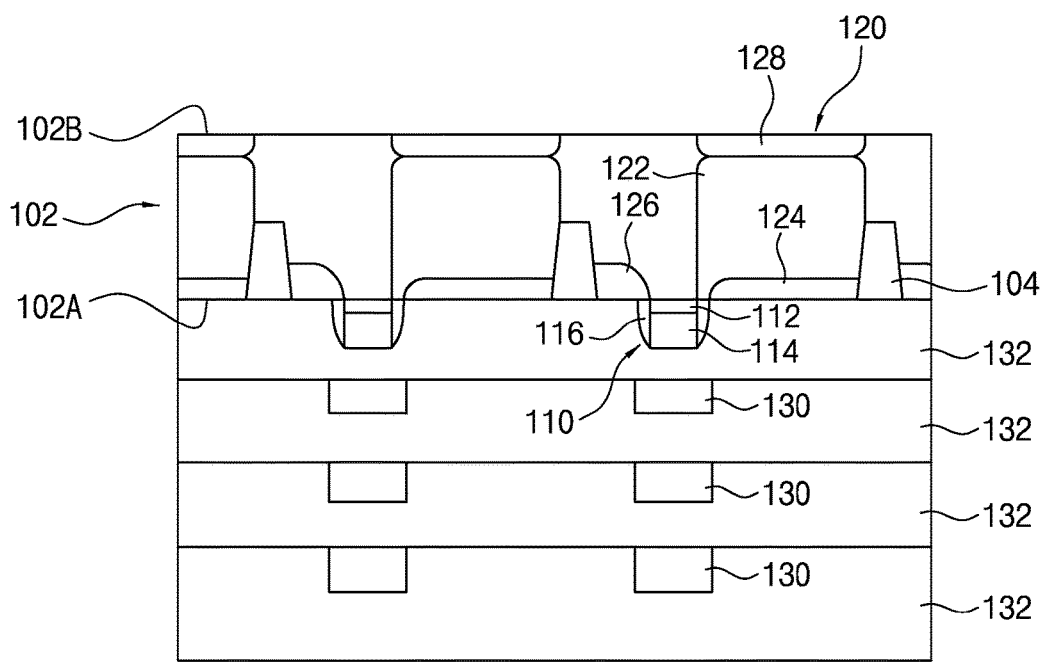

Referring to FIG. 11, a back-grinding process or a chemical and mechanical polishing process may be performed in order to reduce a thickness of the substrate 102. Further, backside pinning layers 128 having the first conductivity type may be formed between a backside surface 102B of the substrate 102 and the charge accumulation regions 122. For example, p-type impurity regions functioning as the backside pinning layers 128 may be formed by an ion implantation process, and may then be activated by a subsequent laser annealing process.

Alternatively, the backside pinning layers 128 may be formed prior to the charge accumulation regions 122. For example, after forming the backside pinning layers 128, the charge accumulation regions 122 may be formed on the backside pinning layers 128, and the frontside pinning layers 124 may then be formed on the charge accumulation regions 122. In such case, the backside pinning layers 128 may be activated by the rapid heat treatment process along with the charge accumulation regions 122 and the frontside pinning layers 124. Further, the back-grinding process may be performed such that the backside pinning layers 128 are exposed.

Figure 12:
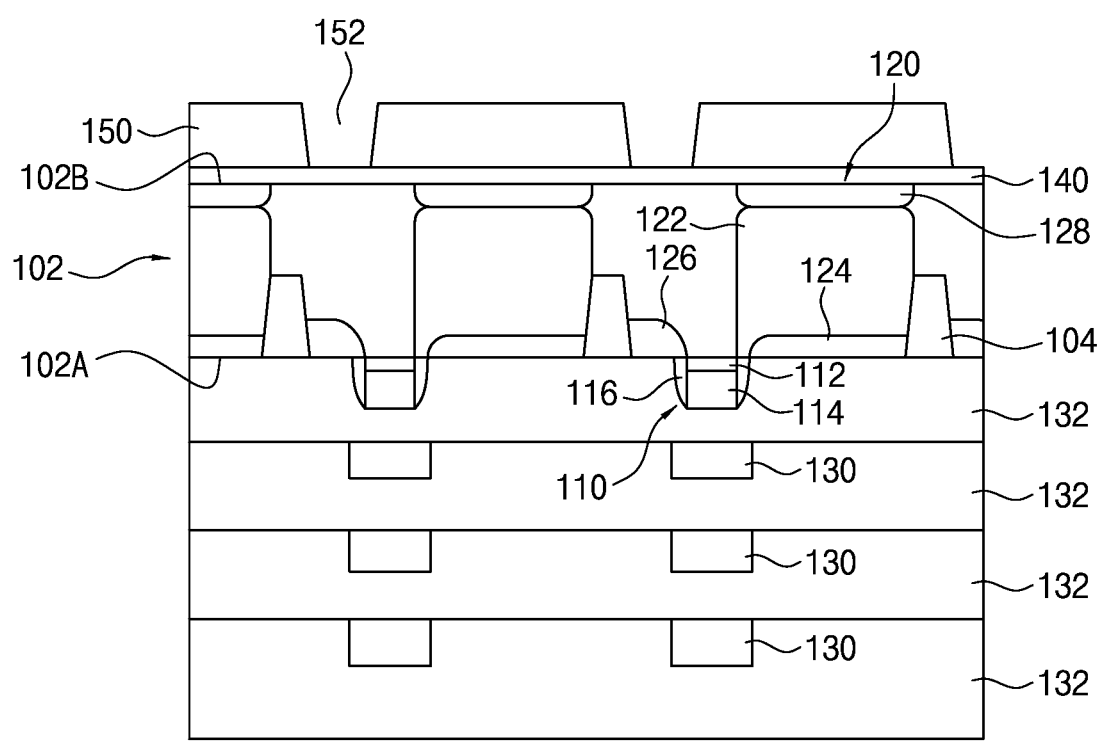

Referring to FIG. 12, an anti-reflective layer 140 may be formed on the backside surface 102B of the substrate 102, and a mold layer 150 may then be formed on the anti-reflective layer 140. The mold layer 150 may be partially etched so as to form trenches 152 for forming a light-blocking pattern 162. The trenches 152 may be arranged between the pixel regions 120 in a plan view. Particularly, the trenches 152 may be formed by an anisotropic etching process, and the anti-reflective layer 140 may be used as an etch stop layer in the anisotropic etching process. Further, the trenches 152 may be formed to have a width decreasing toward the backside surface 102B of the substrate 102 by the anisotropic etching process. For example, the anti-reflective layer 140 may be formed of silicon nitride, and the mold layer 150 may be formed of silicon oxide.

Figure 13:
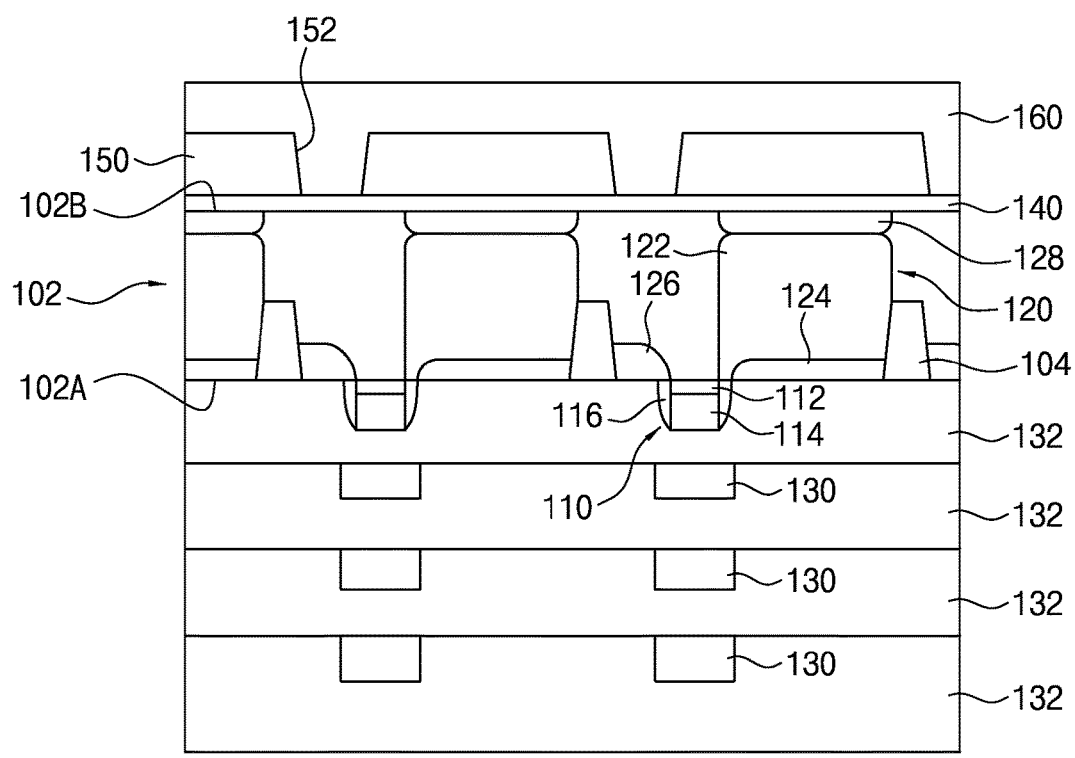
Figure 14:
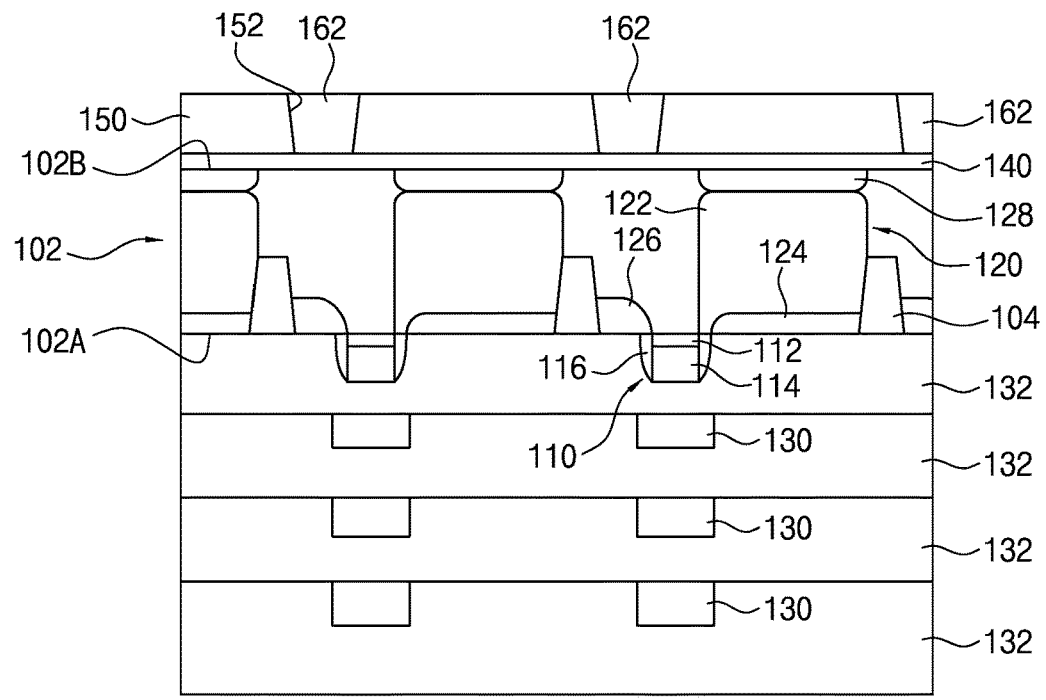

Referring to FIG. 13, a metal layer 160 may be formed on the mold layer 150 so that the trenches 152 are buried. Then, as shown in FIG. 14, a planarization process may be performed so that the mold layer 150 is exposed, thereby forming the light-blocking pattern 162 in the trenches 152.

For example, a tungsten layer 160 may be formed on the mold layer 150 by a metal organic chemical vapor deposition (MOCVD) process, and thus the trenches 152 may be filled with tungsten. Then, a chemical mechanical polish (CMP) process may be performed so that the mold layer 150 is exposed. As a result, an upper portion of the tungsten layer 160 may be removed by the CMP process, and the light-blocking pattern 162 may thus be formed in the trenches 152.

Figure 15:
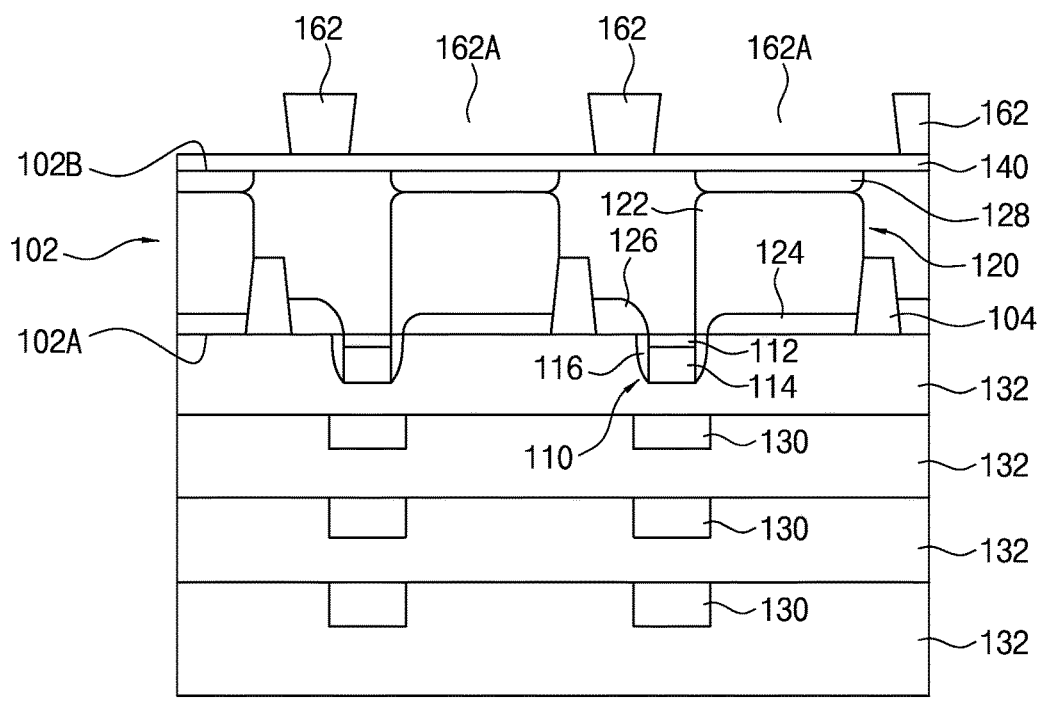

Referring to FIG. 15, the mold layer 150 may be removed by an isotropic etching process, for example, a wet etching process, thereby forming the light-blocking pattern 162 having openings 162A corresponding to the pixel regions 120. Then, a passivation layer 180 may be formed on the anti-reflective layer 140 and the light-blocking pattern 162 as shown in FIG. 1. For example, the passivation layer 180 may include silicon oxide such as tetra-ethyl-ortho-silicate (TEOS), undoped silica glass (USG), and the like, and may be formed by a chemical vapor deposition (CVD) process. Then, a color filter layer 192 and a micro lens array 194 may be sequentially formed on the passivation layer 180.

Alternatively, after performing the planarization process so that the mold layer 150 is exposed, a passivation layer 182 may be formed on the mold layer 150 and the light-blocking pattern 162 as shown in FIG. 2. Then, a color filter layer 192 and a micro lens array 194 may be sequentially formed on the passivation layer 182.

Figure 16:
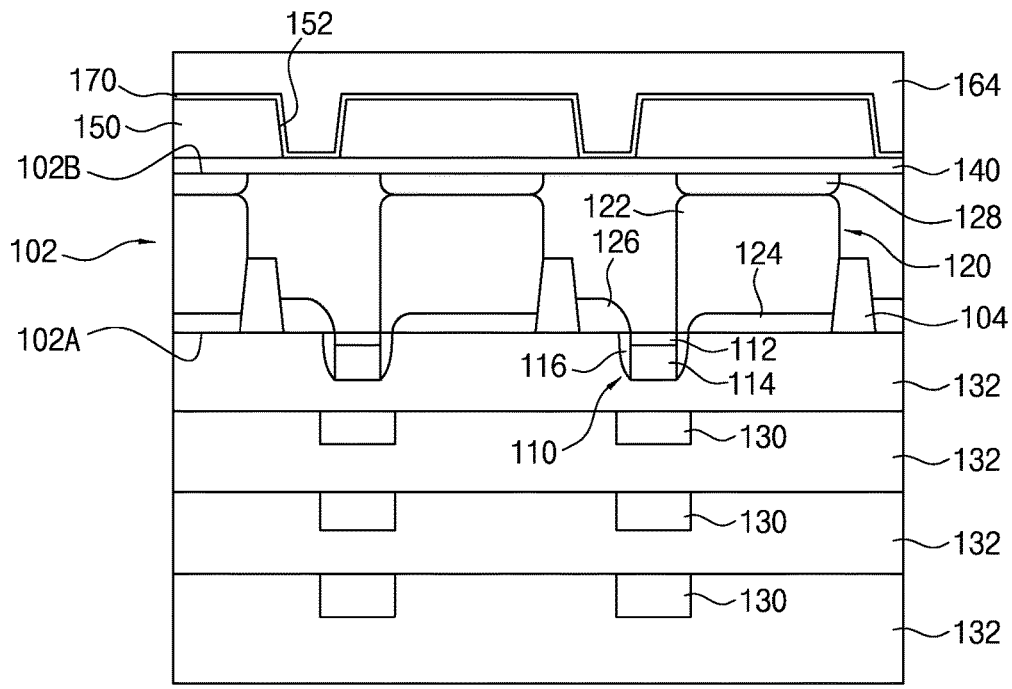
FIGS. 16 and 17 are cross-sectional views illustrating a method of manufacturing the backside illuminated image sensor as shown in FIG. 3.
Figure 17:
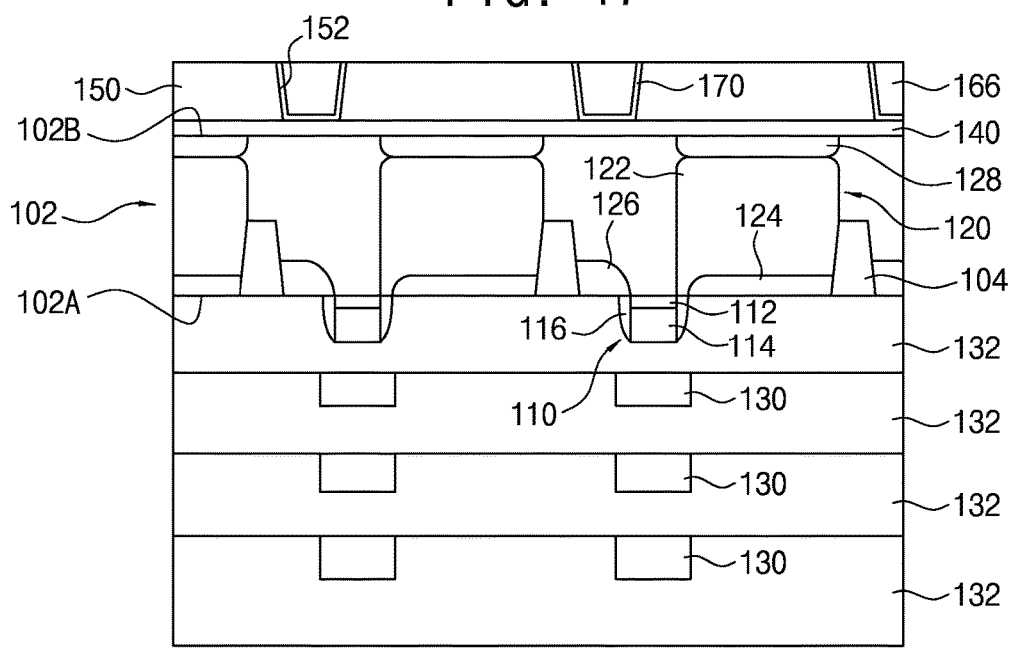

FIGS. 16 and 17 are cross-sectional views illustrating a method of manufacturing the backside illuminated image sensor as shown in FIG. 3.

Referring to FIG. 16, after forming the mold layer 150 having the trenches 152 on the anti-reflective layer 140, a diffusion barrier layer 170 for preventing metal diffusion may be formed on the mold layer 150 and a portion of the anti-reflective layer 140 exposed by the trenches 152. For example, the diffusion barrier layer 170 may include tungsten nitride, titanium nitride, tantalum nitride, and the like, and may be formed by a MOCVD process.

After forming the diffusion barrier layer 170, a metal layer 164 may be formed on the diffusion barrier layer 170 so that the trenches 152 are buried. The metal layer 164 may include tungsten, aluminum, copper, and the like, and may be formed by a MOCVD process, a vacuum deposition process, an electroplating process, etc.

Referring to FIG. 17, a planarization process such as a CMP process may be performed so that the mold layer 150 is exposed, thereby forming a light-blocking pattern 166 in the trenches 152. Then, the mold layer 150 may be removed by an isotropic etching process, and a passivation layer 184, a color filter layer 192 and a micro lens array 194 may be sequentially formed on the anti-reflective layer 140, the light-blocking pattern 166 and the diffusion barrier layer 170 as shown in FIG. 3.

Alternatively, after performing the planarization process so that the mold layer 150 is exposed, a passivation layer 186 may be formed on the mold layer 150 and the light-blocking pattern 166 as shown in FIG. 4. Then, a color filter layer 192 and a micro lens array 194 may be sequentially formed on the passivation layer 186.

Figure 18:
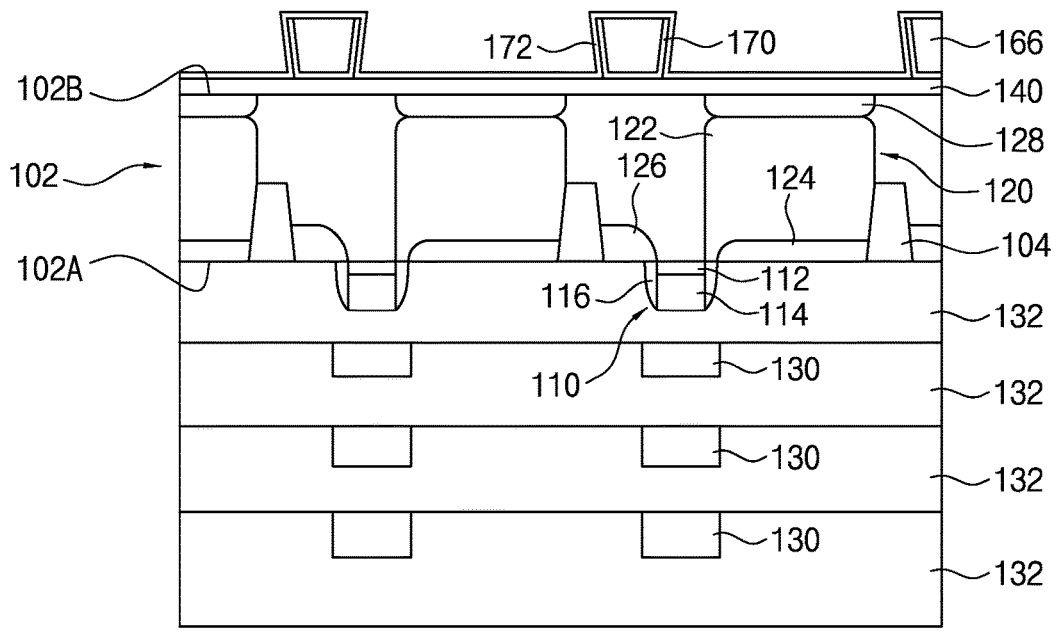
FIG. 18 is a cross-sectional view illustrating a method of manufacturing the backside illuminated image sensor as shown in FIG. 5.

FIG. 18 is a cross-sectional view illustrating a method of manufacturing the backside illuminated image sensor as shown in FIG. 5.

Referring to FIG. 18, after removing the mold layer 150, a second diffusion barrier layer 172 may be formed on the anti-reflective layer 140, the light-blocking pattern 166 and the diffusion barrier layer 170. The second diffusion barrier layer 172 may include silicon nitride and may be formed by a CVD process. Then, a passivation layer 188, a color filter layer 192 and a micro lens array 194 may be sequentially formed on the second diffusion barrier layer 172 as shown in FIG. 5.

Figure 19:
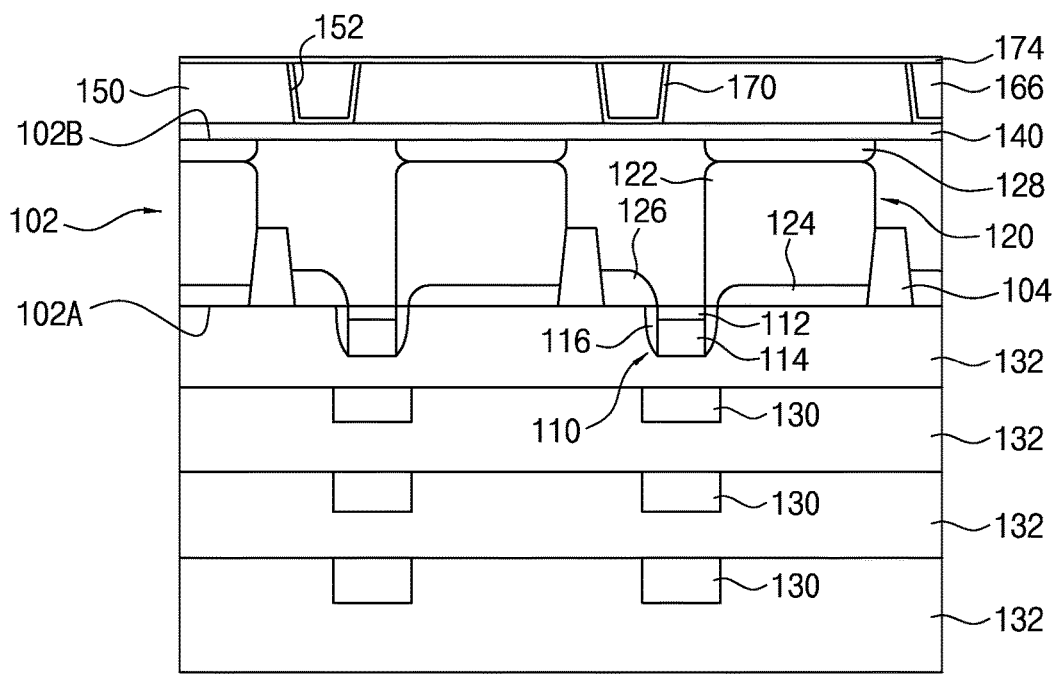
FIG. 19 is a cross-sectional view illustrating a method of manufacturing the backside illuminated image sensor as shown in FIG. 6.

FIG. 19 is a cross-sectional view illustrating a method of manufacturing the backside illuminated image sensor as shown in FIG. 6.

Referring to FIG. 19, after performing the planarization process so that the mold layer 150 is exposed, a second diffusion barrier layer 174 may be formed on the exposed mold layer 150 and the light-blocking pattern 166. The second diffusion barrier layer 174 may include silicon nitride and may be formed by a CVD process. Then, a passivation layer 190, a color filter layer 192 and a micro lens array 194 may be sequentially formed on the second diffusion barrier layer 174 as shown in FIG. 6.

In accordance with the exemplary embodiments of the present disclosure as described above, a backside illuminated image sensor may include pixel regions 120 disposed in a substrate 102, an anti-reflective layer 140 disposed on a backside surface 102B of the substrate 102, a light-blocking pattern 162 disposed on the anti-reflective layer 140 and having openings 162A corresponding to the pixel regions 120, a color filter layer 192 disposed on the light-blocking pattern 162, and a micro lens array 194 disposed on the color filter layer 192, wherein the light-blocking pattern 162 may have a width decreasing toward the backside surface 102B of the substrate 102.

That is, side surfaces of the light-blocking pattern 162 may have a negative slope, and the light reflection on the side surfaces of the light-blocking pattern 162 may thus be reduced.

As a result, the light loss and the crosstalk due to the light reflection on the side surfaces of the light-blocking pattern 162 may be significantly reduced.

Further, the light-blocking pattern 162 may be formed by a damascene process using a metal material, thereby relatively increasing a thickness of the light-blocking pattern 162. As a result, the effect of reducing the crosstalk by using the light-blocking pattern 162 may be significantly improved.

Although the backside illuminated image sensor 100 and the method of manufacturing the same have been described with reference to specific embodiments, they are not limited thereto. Therefore, it will be readily understood by those skilled in the art that various modifications and changes can be made thereto without departing from the spirit and scope of the present disclosure defined by the appended claims.

The invention claimed is:

1. A backside illuminated image sensor comprising:
   a plurality of pixel regions disposed in a substrate;
   an anti-reflective layer disposed on a backside surface of the substrate;
   a light-blocking pattern disposed on the anti-reflective layer and having openings corresponding to the plurality of pixel regions;
   a color filter layer disposed on the light-blocking pattern; and
   a micro lens array disposed on the color filter layer,
   wherein the light-blocking pattern has a width decreasing toward the backside surface of the substrate, and
   each of the pixel regions comprises:
      a charge accumulation region disposed in the substrate;
      a frontside pinning layer disposed between a frontside surface of the substrate and the charge accumulation region; and
      a backside pinning layer disposed between the backside surface of the substrate and the charge accumulation region.

2. The backside illuminated image sensor of claim 1, further comprising:
   a plurality of floating diffusion regions disposed in the substrate and spaced apart from each of the pixel regions; and
   a plurality of gate structures disposed on the frontside surface of the substrate and each arranged between a corresponding one of the plurality of pixel regions and a corresponding one of the floating diffusion regions.

3. The backside illuminated image sensor of claim 1, further comprising:
   a passivation layer disposed on the anti-reflective layer and the light-blocking pattern,
   wherein the color filter layer is disposed on the passivation layer.

4. The backside illuminated image sensor of claim 1, further comprising:
   a mold layer disposed on the anti-reflective layer and having trenches for forming the light-blocking pattern; and
   a passivation layer disposed on the mold layer and the light-blocking pattern.

5. The backside illuminated image sensor of claim 1, further comprising:
   a diffusion barrier layer disposed on side surfaces of the light-blocking pattern and between the anti-reflective layer and the light-blocking pattern.

6. The backside illuminated image sensor of claim 5, further comprising:
   a second diffusion barrier layer disposed on the light-blocking pattern.

7. A method of manufacturing a backside illuminated image sensor, the method comprising:
   forming a plurality of pixel regions in a substrate;
   forming an anti-reflective layer on a backside surface of the substrate;
   forming a light-blocking pattern having openings corresponding to each of the plurality of pixel regions on the anti-reflective layer;
   forming a color filter layer on the light-blocking pattern; and
   forming a micro lens array on the color filter layer,
   wherein the light-blocking pattern has a width decreasing toward the backside surface of the substrate, and
   forming the plurality of pixel regions comprises:
      forming charge accumulation regions in the substrate; and
      forming frontside pinning layers between a frontside surface of the substrate and the charge accumulation regions; and
      forming backside pinning layers between the backside surface of the substrate and the charge accumulation regions.

8. The method of claim 7, further comprising:
   forming floating diffusion regions in the substrate to be spaced apart from the plurality of pixel regions; and forming gate structures on a frontside surface of the substrate and between the pixel regions and the floating diffusion regions.

9. A method of manufacturing a backside illuminated image sensor, the method comprising:

forming a plurality of pixel regions in a substrate;

forming an anti-reflective layer on a backside surface of the substrate;

forming a light-blocking pattern having openings corresponding to each of the plurality of pixel regions on the anti-reflective layer;

forming a color filter layer on the light-blocking pattern; and forming a micro lens array on the color filter layer, wherein the forming a light-blocking pattern comprises:

forming a mold layer on the anti-reflective layer to have trenches for forming the light-blocking pattern;

forming a metal layer on the mold layer so that the trenches are buried; and performing a planarization process so that the mold layer is exposed to form the light-blocking pattern in the trenches, and wherein the trenches have a width decreasing toward the backside surface of the substrate so that the light-blocking pattern has a width decreasing toward the backside surface of the substrate.

10. The method of claim 9, further comprising:

removing the mold layer after forming the light-blocking pattern; and forming a passivation layer on the anti-reflective layer and the light-blocking pattern.

11. The method of claim 9, further comprising:

forming a passivation layer on the mold layer and the light-blocking pattern.

12. The method of claim 9, further comprising:

forming a diffusion barrier layer on the mold layer and a portion of the anti-reflective layer exposed by the trenches before forming the metal layer.

13. The method of claim 9, further comprising:

forming a second diffusion barrier layer on the light-blocking pattern.

\* \* \* \* \*